US010028417B2

(12) United States Patent
Schmidtke et al.

(10) Patent No.: US 10,028,417 B2
(45) Date of Patent: Jul. 17, 2018

(54) MODULAR NETWORK SWITCHES, ASSOCIATED STRUCTURES, AND ASSOCIATED METHODS OF MANUFACTURE AND USE

(71) Applicant: Facebook, Inc., Menlo Park, CA (US)

(72) Inventors: Hans-Juergen Schmidtke, Mountain View, CA (US); Zhiping Yao, Dublin, CA (US); Che Kin Leung, Fremont, CA (US); Xu Wang, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/291,348

(22) Filed: Oct. 12, 2016

(65) Prior Publication Data
US 2017/0332519 A1 Nov. 16, 2017

Related U.S. Application Data

(60) Provisional application No. 62/335,000, filed on May 11, 2016.

(51) Int. Cl.
*G06F 1/18* (2006.01)
*H04L 12/933* (2013.01)
(Continued)

(52) U.S. Cl.
CPC ......... *H05K 7/20736* (2013.01); *G06F 1/181* (2013.01); *G06F 1/183* (2013.01);
(Continued)

(58) Field of Classification Search
CPC ....... H05K 7/20145; H05K 7/20554–7/20572; H05K 7/20718–7/20736; H05K 7/20171
(Continued)

(56) References Cited

U.S. PATENT DOCUMENTS 5,629,836 A    5/1997   Wright et al.
5,729,752 A *   3/1998   Snider ................... G06F 13/409
                                                   712/1

(Continued)

OTHER PUBLICATIONS

European Perforators Association, The Advantages of Perporated Metals, Aug. 21, 2016, Europerf.*

(Continued)

*Primary Examiner* — Dion R Ferguson
*Assistant Examiner* — Amir Jalali
(74) *Attorney, Agent, or Firm* — FisherBroyles, LLP

(57) ABSTRACT

Modular network switches and other computer systems are described herein. A modular network switch can include a latching device for installing and removing computer modules (e.g., line cards) from an associated cabinet or enclosure. The network switch can also include interconnected computer modules (e.g., line cards, fabric cards, control modules, etc.) that include circuit boards oriented parallel to the flow of cooling air through the cabinet in the absence of a backplane or midplane oriented perpendicular to the air flow. The absence of such backplanes and/or midplanes provides a more direct air flow path through the cabinet, thereby enabling a more efficient flow of cooling air and lower operating temperatures. Additionally, the network switch can include an orthogonal arrangement of data planes, control planes, and/or power planes that can be efficiently interconnected to increase operational speed and further facilitate the flow of cooling air through the computer cabinet.

20 Claims, 12 Drawing Sheets

(51) Int. Cl.
*H04L 12/935* (2013.01)
*H05K 7/20* (2006.01)
*H05K 1/14* (2006.01)
*H05K 7/14* (2006.01)
*H05K 5/00* (2006.01)

(52) U.S. Cl.
CPC .............. *H04L 49/15* (2013.01); *H04L 49/30* (2013.01); *H05K 1/14* (2013.01); *H05K 5/0004* (2013.01); *H05K 7/1489* (2013.01)

(58) Field of Classification Search
USPC ................ 361/679.48–679.51, 679.58, 695, 361/726–727; 454/184; 165/80.1–80.3; 175/547, 549
See application file for complete search history.

(56) References Cited

U.S. PATENT DOCUMENTS

| | | | |
|---|---|---|---|
| 5,997,326 | A | 12/1999 | Koradia et al. |
| 6,373,713 | B1 | 4/2002 | Jensen et al. |
| 6,381,146 | B1 | 4/2002 | Sevier et al. |
| 6,422,876 | B1* | 7/2002 | Fitzgerald ............ H01R 12/716 361/784 |
| 6,637,846 | B2 | 10/2003 | Yang et al. |
| 6,814,582 | B2 | 11/2004 | Vadasz et al. |
| 7,050,307 | B2 | 5/2006 | Doblar et al. |
| 7,092,642 | B2 | 8/2006 | Way et al. |
| 7,435,095 | B1 | 10/2008 | Yi et al. |
| 8,154,867 | B2 | 4/2012 | Shearman et al. |
| 9,136,624 | B1 | 9/2015 | Reynov et al. |
| 9,686,886 | B2 | 7/2017 | Okada et al. |
| 2003/0080568 | A1 | 5/2003 | Busby et al. |
| 2004/0002237 | A1* | 1/2004 | Doblar .................. G06F 1/184 439/74 |
| 2004/0047128 | A1 | 3/2004 | McClelland, II et al. |
| 2005/0207134 | A1* | 9/2005 | Belady .................... H05K 1/14 361/796 |
| 2006/0049727 | A1* | 3/2006 | Corsini ................ H05K 7/1425 312/213 |
| 2006/0121421 | A1* | 6/2006 | Spitaels ................. G06F 1/206 434/118 |
| 2007/0184676 | A1* | 8/2007 | Minich ............... H01R 12/714 439/65 |
| 2011/0013348 | A1* | 1/2011 | Seibold .................. G06F 1/189 361/679.02 |
| 2012/0120596 | A1* | 5/2012 | Bechtolsheim .......... G06F 1/20 361/679.48 |
| 2013/0337665 | A1 | 12/2013 | Cohen et al. |
| 2014/0098492 | A1* | 4/2014 | Lam ................... H05K 7/20727 361/692 |
| 2014/0206273 | A1* | 7/2014 | Larsen ............... H05K 7/20709 454/184 |
| 2014/0307400 | A1 | 10/2014 | French et al. |
| 2014/0362874 | A1 | 12/2014 | Nishimoto |
| 2015/0229438 | A1 | 8/2015 | Le Taillandier De Gabory et al. |
| 2016/0077556 | A1* | 3/2016 | Gong ..................... G06F 1/181 361/679.32 |
| 2016/0128230 | A1* | 5/2016 | Lam ................... H05K 7/20727 361/695 |
| 2016/0197679 | A1 | 7/2016 | Takahara et al. |
| 2017/0245030 | A1 | 8/2017 | Lyubomirsky |
| 2017/0329371 | A1 | 11/2017 | Schmidtke et al. |
| 2017/0331766 | A1 | 11/2017 | Schmidtke et al. |
| 2017/0332506 | A1 | 11/2017 | Schmidtke et al. |
| 2017/0332518 | A1 | 11/2017 | Schmidtke et al. |

OTHER PUBLICATIONS

U.S. Appl. No. 15/291,263 by Schmidtke, H. et al., filed Oct. 12, 2016.
U.S. Appl. No. 15/291,293 by Schmidtke, H. et al., filed Oct. 12, 2016.
U.S. Appl. No. 15/291,313 by Schmidtke, H. et al., filed Oct. 12, 2016.
U.S. Appl. No. 15/291,324 by Schmidtke, H. et al., filed Oct. 12, 2016.
U.S. Appl. No. 15/338,255 by Lyubomirsky, I., et al., filed Oct. 28, 2016.
Non-Final Office Action dated Aug. 29, 2017 for U.S. Appl. No. 15/291,293 by Schmidtke, H., et al., filed Oct. 12, 2016.
U.S. Appl. No. 15/655,795 by Schmidtke, H. et al. filed Jul. 20, 2017.
U.S. Appl. No. 15/705,205 by Schmidtke, H. et al. filed Sep. 14, 2017.
U.S. Appl. No. 15/706,561 by Schmidtke, H. et al. filed Sep. 15, 2017.
Non-Final Office Action dated Jun. 15, 2017 for U.S. Appl. No. 15/338,255 by Lyubomirsky, I., et al., filed Oct. 28, 2016.
Notice of Allowance dated Jul. 3, 2017 for U.S. Appl. No. 15/291,313 by Schmidtke, H.J.., et al., filed Oct. 12, 2016.
U.S. Appl. No. 15/725,239 by Taylor, J., et al., filed Oct. 4, 2017.
U.S. Appl. No. 15/716,454 by Schmidtke, K. filed Sep. 26, 2017.
Corrected Notice of Allowability dated Nov. 21, 2017 for U.S. Appl. No. 15/291,313 by Schmidtke, H., et al., filed Oct. 12, 2016.
Non-Final Office Action dated Nov. 24, 2017 for U.S. Appl. No. 15/291,263 by Schmidtke, H., et al., filed Oct. 12, 2016.
Notice of Allowance dated Dec. 6, 2017 for U.S. Appl. No. 15/291,293 by Schmidtke, H., et al., filed Oct. 12, 2016.

* cited by examiner

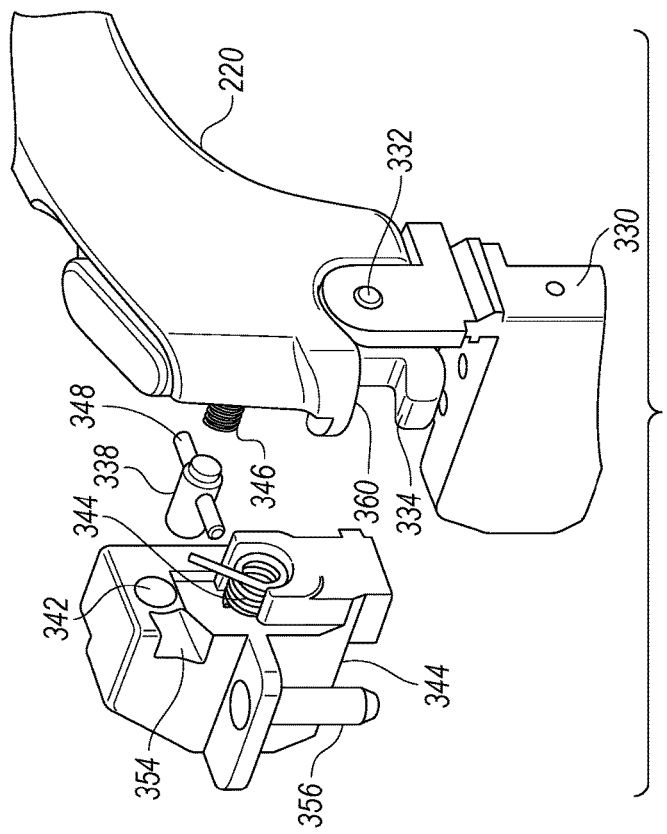
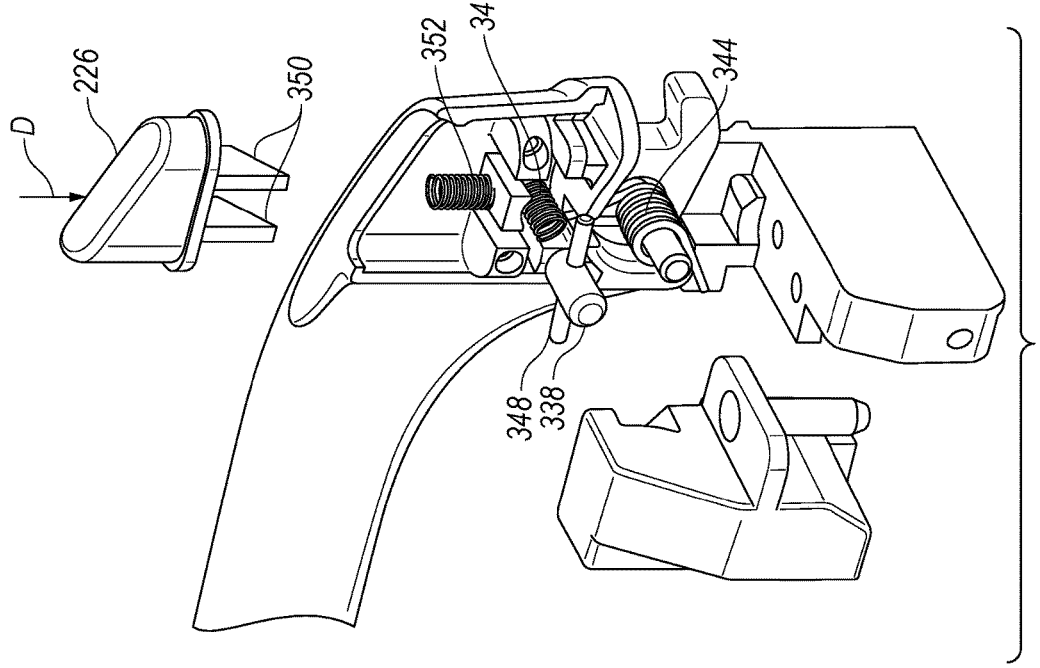

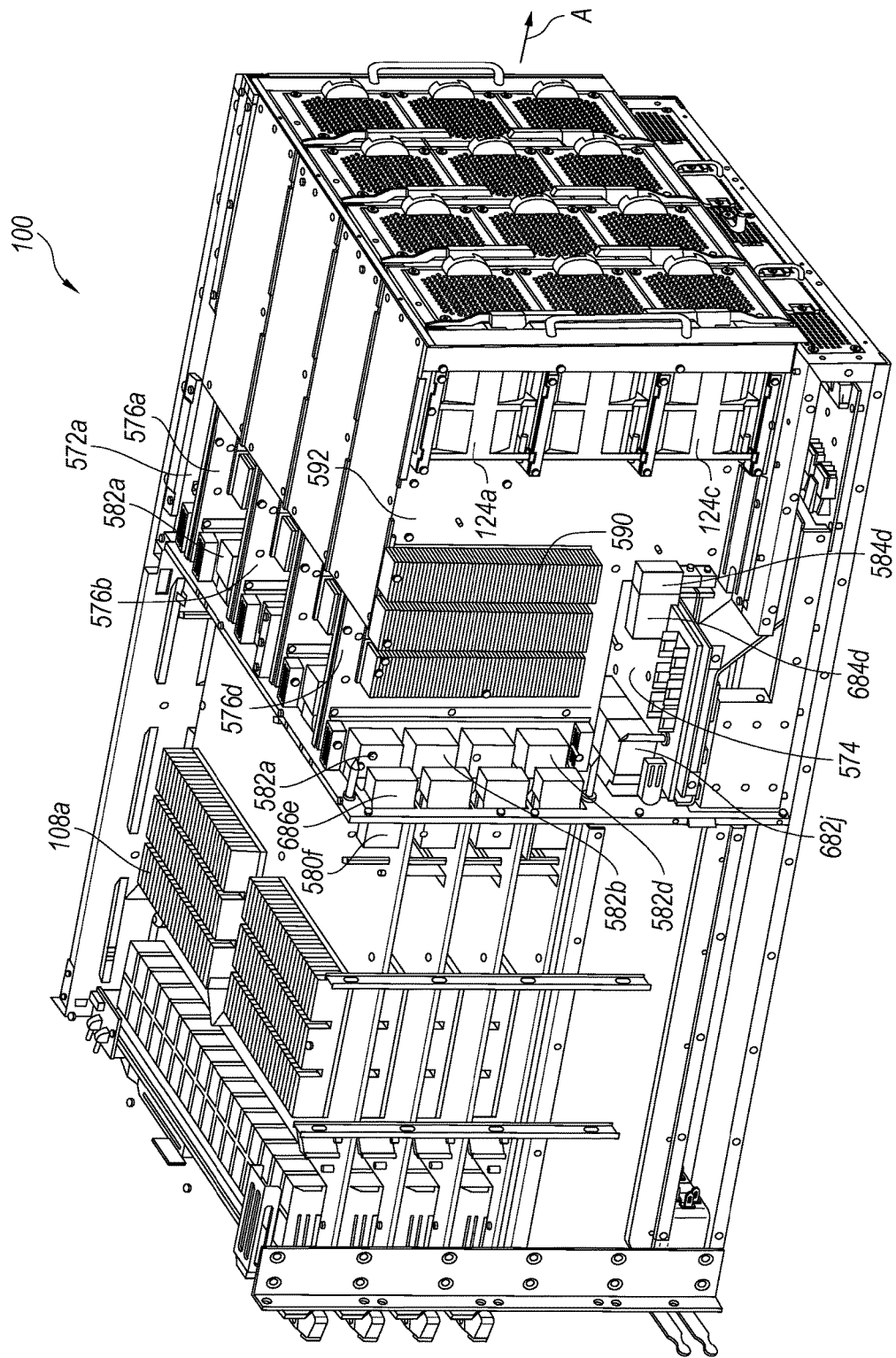

MODULAR NETWORK SWITCHES, ASSOCIATED STRUCTURES, AND ASSOCIATED METHODS OF MANUFACTURE AND USE

CROSS-REFERENCE TO RELATED APPLICATION(S) INCORPORATED BY REFERENCE

The present application claims priority to and the benefit of U.S. Provisional Patent Application No. 62/335,000, filed May 11, 2016, and titled MODULAR SWITCH, which is incorporated herein by reference in its entirety.

TECHNICAL FIELD

The following disclosure relates generally to computer systems and, more particularly, to network switch architectures and associated apparatuses, systems and methods.

BACKGROUND

Network switches (also known as a switching hubs, bridging hubs, MAC bridges or simply "switches") are computer networking devices that connect other devices together in a computer network. Network switches are typically used in complex data networking environments to, for example, interconnect various devices within one or more subnetworks. Some network switches use packet switching to receive, process, and forward data to destination devices. Switches can be used for electrical switching, optical switching that enables signals in optical fibers or integrated optical circuits to be selectively switched from one circuit to another, or a combination of electrical and optical switching.

Typical network switches include a plurality of circuit boards with associated switch circuitry (e.g. line cards and fabric cards) that are interconnected via backplane or midplane circuit boards within an enclosure. Although some cards include handles for manually removing the cards from the enclosure, conventional handles (particularly for optical cards) do not have locking features to hold the cards in place. Additionally, such handles typically require manual manipulation to eject the cards from the enclosure.

As is known, line cards typically include a modular electronic circuit designed to fit on a separate printed circuit board (PCB) and interface with a data communications network, and can provide transmitting/receiving ports for a local area network (LAN) and/or a wide area network (WAN). Fabric cards can include one or more switch elements for implementing the stages of the switch fabric. The line cards and fabric cards can be mounted to the backplane and/or midplane in a motherboard/daughterboard relationship in which the backplane or midplane extends transversely across the enclosure. In this arrangement, the backplane/midplane is perpendicular to the flow of cooling air through the enclosure, and can block or otherwise impede the flow of cooling air, resulting in relatively high operating temperatures that can reduce the longevity and/or performance of switch components. Another factor that can affect cooling is the efficiency of the air inlets and air outlets on the switch enclosure. Conventional network switches utilize fans to move cooling air through the enclosure and maintain the electronic components at suitable operating temperatures. Typically, perforated sheet metal is used to form air inlet and outlet vents on the front and back of the enclosure, respectively. Although such material can provide suitable covers for the enclosure, limitations on the size of the perforations limit the amount of air flow into the enclosure and can result in less than optimum cooling.

In conventional network switches, the central processing units (CPUs) are typically mounted to line cards. As a result, upgrading CPUs in a conventional switch generally requires removal and replacement of line cards to change out the CPUs. CPU technology, however, tends to advance at a relatively quick pace, which can lead to relatively frequent line card removal and replacement for CPU upgrades in conventional switches. In view of the shortcomings associated with conventional network switches, it would be advantageous to develop a network switch that provides, among other things, efficient cooling and relatively easy component replacement.

BRIEF DESCRIPTION OF THE DRAWINGS

FIGS. 5A and 5B are front and rear isometric views, respectively, of the computer system 100 with a number of external panels removed for purposes of illustrating the arrangement of various internal structures and systems in accordance with an embodiment of present technology.

DETAILED DESCRIPTION

Figure 1A:
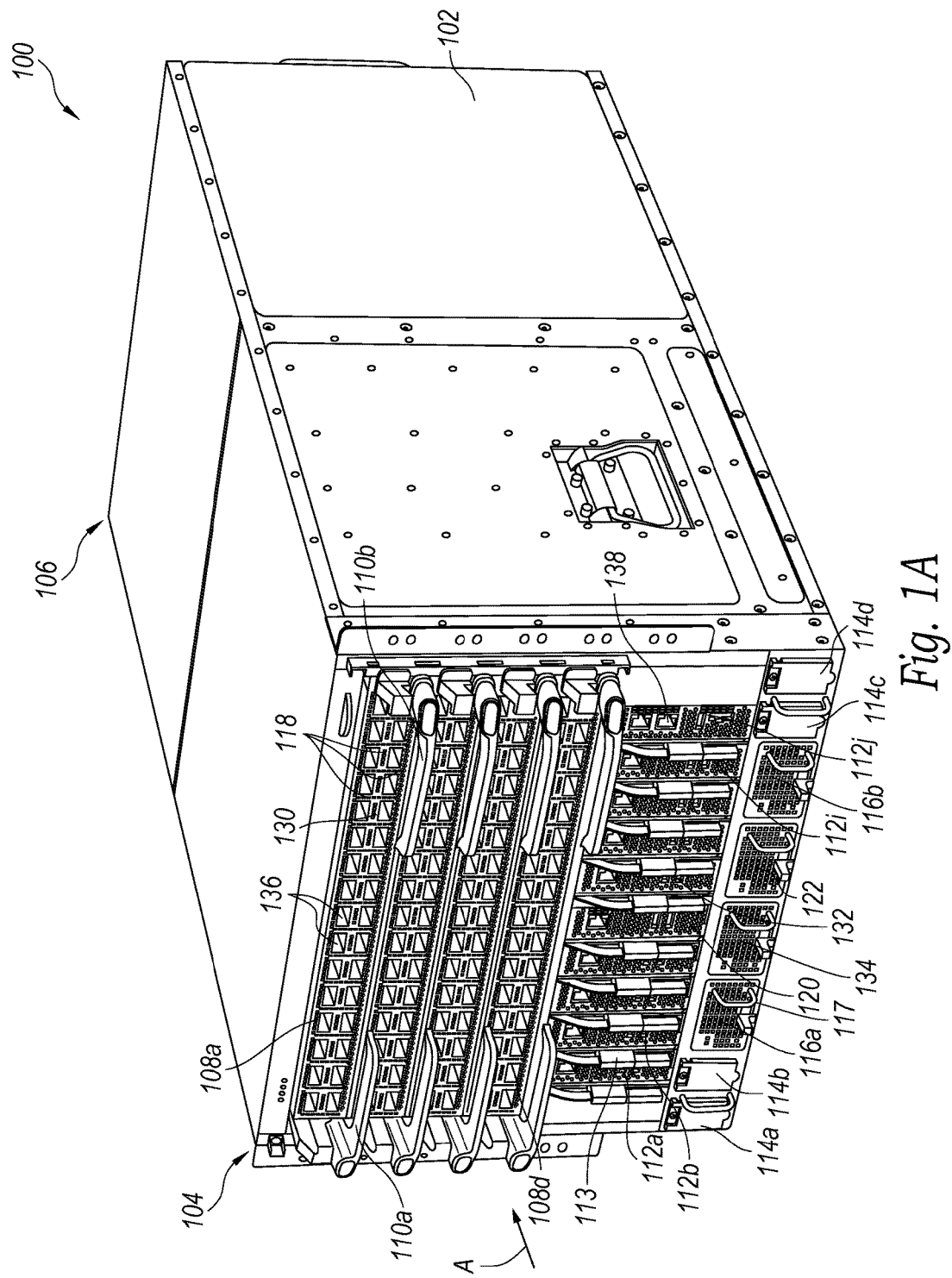
FIGS. 1A and 1B are front and rear isometric views, respectively, of a computer system configured in accordance with an embodiment of the present technology.

The following disclosure describes various embodiments of modular network switches for use in, for example, highly-functioning data computing environments, such as server data computing environments, data centers, etc. In some embodiments, a modular network switch configured in accordance with the present technology can include a latching apparatus for quickly and easily securing switch components (e.g., line cards, etc.) in a cabinet or other enclosure, and easily removing the components for upgrade or replacement. In other embodiments, network switches configured in accordance with the present technology can include an orthogonal arrangement of internal components (e.g., data planes, control planes, and power planes, etc.). In these embodiments, the associated circuit boards are oriented parallel to a flow of cooling air through the switch cabinet, and the switch lacks a backplane, midplane, or other mounting structure (e.g., another circuit board) oriented perpendicular to the air flow in a blocking relationship. As a result, the orthogonal arrangement enables a parallel flow of cooling air through the cabinet without the obstruction of a backplane or midplane. This can result in lower component operating temperatures than conventional switches having, e.g., backplanes or midplanes that block front-to-back air flow. In further embodiments, network switches configured in accordance with the present technology can include a distributed central processing unit (CPU) design in which one or more CPUs (and/or graphics processing units (GPU), or other digital computing processor) are positioned near the front side of the cabinet on independent circuit boards so that they can be easily replaced and/or upgraded while the other components of the switch remain in place. The foregoing are only some of the aspects of the various embodiments of network switches and other computer systems described herein, and further details describing these aspects are provided below.

Certain details are set forth in the following description and in FIGS. 1-7 to provide a thorough understanding of various embodiments of the present technology. In other instances, well-known structures, materials, operations and/or systems often associated with network switches, circuit boards, electrical connectors, computer hardware, and associated systems and methods are not shown or described in detail in the following disclosure to avoid unnecessarily obscuring the description of the various embodiments of the technology. Those of ordinary skill in the art will recognize, however, that the present technology can be practiced without one or more of the details set forth herein, or with other structures, methods, components, and so forth.

The terminology used below is to be interpreted in its broadest reasonable manner, even though it is being used in conjunction with a detailed description of certain examples of embodiments of the technology. Indeed, certain terms may even be emphasized below; however, any terminology intended to be interpreted in any restricted manner will be overtly and specifically defined as such in this Detailed Description section.

The accompanying Figures depict embodiments of the present technology and are not intended to be limiting of its scope. The sizes of various depicted elements are not necessarily drawn to scale, and these various elements may be arbitrarily enlarged to improve legibility. Component details may be abstracted in the Figures to exclude details such as position of components and certain precise connections between such components when such details are unnecessary for a complete understanding of how to make and use the invention. Additionally, many of the details, dimensions, angles and other features shown in the Figures are merely illustrative of particular embodiments of the disclosure. Accordingly, other embodiments can have other details, dimensions, angles and features without departing from the spirit or scope of the present invention. In addition, those of ordinary skill in the art will appreciate that further embodiments of the invention can be practiced without several of the details described below. In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1.

Figure 1B:
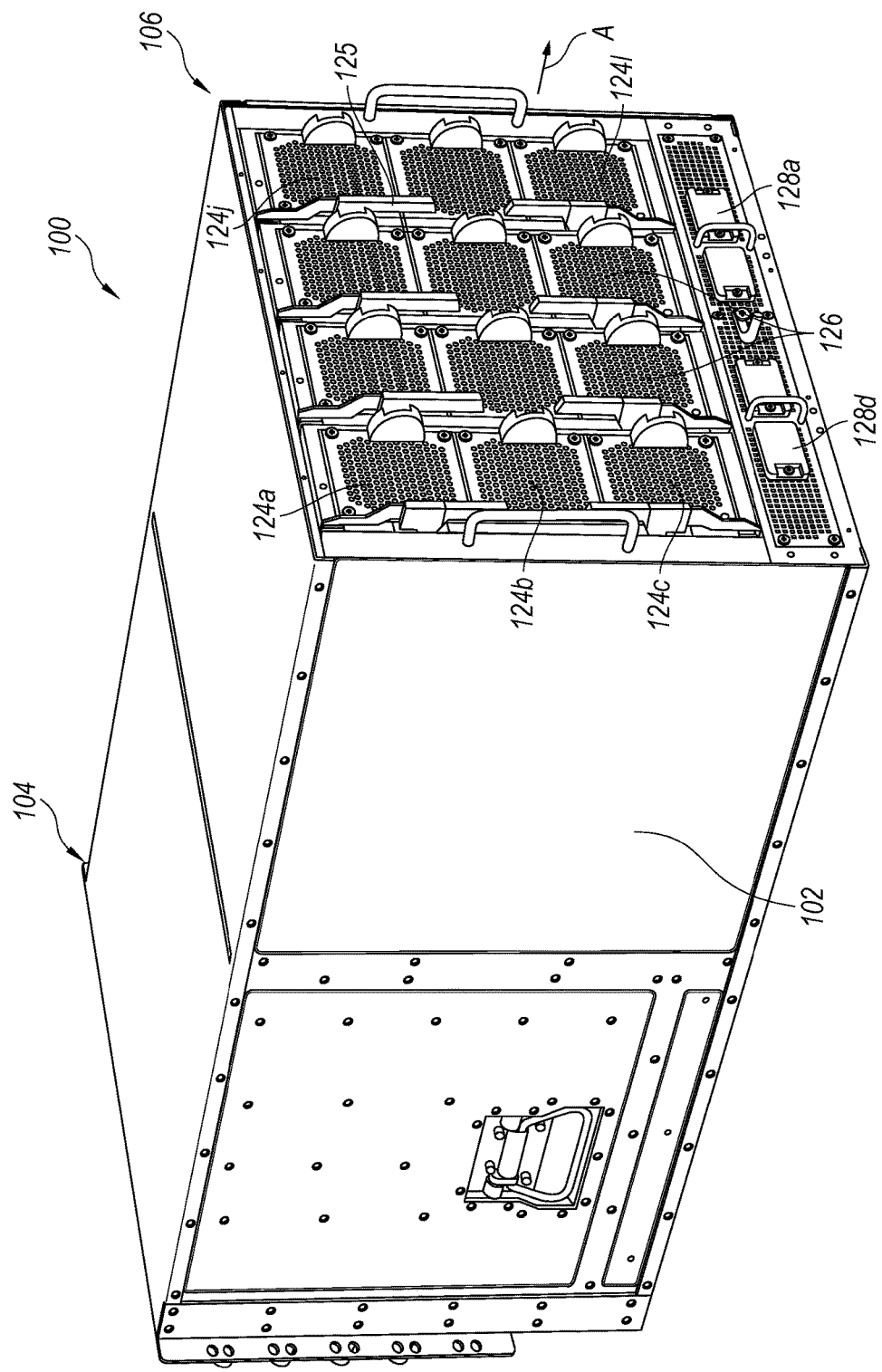

FIGS. 1A and 1B are front and rear isometric views, respectively, of a computer system 100 configured in accordance with an embodiment of the present technology. In the illustrated embodiment, the computer system 100 is a modular network switch, and is referred to herein as a "network switch 100" or simply "switch 100" for ease of reference. In other embodiments, however, the computer system 100 and various embodiments of the technology described herein can be implemented in other types of computer systems, including other types of switch systems, server systems, etc. The computer system 100 includes an enclosure or cabinet 102 having a front end 104 opposite an aft end 106. The cabinet 102 can be constructed from, for example, sheet metal panels attached to a metal framework using methods and systems well known in the art.

Referring to FIG. 1A, a plurality of computer modules are installed in the cabinet 102 proximate the front end 104. For example, the cabinet 102 contains a plurality of line cards 108 (identified individually as line cards 108a-d) which are arranged horizontally in a front portion of the cabinet 102. Each of the line cards 108 includes at least one port 136 for receiving data from an external device in a network, and at least one application-specific integrated circuit (ASIC) for data packet forwarding. As described in greater detail below, each of the line cards 108 includes a first latch 110a mounted to one side of the line card 108, and a corresponding second latch 110b mounted to an opposite side of the line card 108. The latches 110a and 110b can be essentially mirror images of each other, and can be used to install and retain each of the line cards 108 in position within the cabinet 102. A number of other computer modules are also installed in the cabinet 102 via the front end 104. For example, a plurality of control modules 112 (identified individually as control modules 112a-112j) are vertically oriented side-by-side beneath the line cards 108. By way of example only, the first control module 112a and the tenth control module 112j can be chassis management modules (CMMs) that each carry one or more CPUs for chassis management, and the second control module 112b through the ninth control module 112i can be system controller modules (SCMs) that each carry one or more CPUs for controlling operation of switch elements on the line cards 108 and/or the fabric cards (described below). Each of the control modules 112 can be individually removed from the cabinet 102 by pulling on a corresponding handle 113 and withdrawing the control module 112 from the front end 104. In other embodiments, other types of control modules and/or other types of computer components can be positioned in the cabinet 102 beneath the line cards 108.

In addition to the line cards 108 and the control modules 112, the cabinet 102 further includes a plurality of power units 116a-d removably installed next to each other beneath the control modules 112. The power units 116 can convert mains AC power to, for example, low-voltage regulated DC power for use by the switch components (e.g., the line cards 108, the control modules 112, etc.). Each of the power units 116 can be individually removed from the cabinet 102 by pulling on a corresponding handle 117 to withdraw the power unit 116 from the front end 104. In a further aspect of this embodiment, the network switch 100 can additionally include a plurality of power inlets 114a-d at the front end 104 of the cabinet 102. In the illustrated embodiment, each of the power inlets 114 includes a receptacle which is covered by a movable cover that can be displaced so that an appropriate connector can be connected to the receptacle in a known manner to receive mains AC for each of the power units 116. For example, in one embodiment, the first power inlet 114a can be electrically connected (via, e.g., a suitable wired connection) to the first power unit 116a to receive AC power for the first power unit 116a. Similarly, the second power inlet 114b can receive AC power for the second power unit 116b, and so on for the third and fourth power inlets 114c and d, respectively.

Referring next to FIG. 1B, it should be noted that the aft end 106 of the cabinet 102 also includes a plurality of power inlets 128 (identified individually as power inlets 128*a-d*). Like the power inlets 114 described above with reference to FIG. 1A, each of the power inlets 128 includes a receptacle configured to receive an appropriate power cord connector for providing facility AC power to the power units 116*a-d* (FIG. 1A). More specifically, in the illustrated embodiment, the power inlet 128*a* provides AC power (via, e.g., a suitable wired connection) to the first power unit 116*a*, the second power inlet 128*b* provides AC power to the second power unit 116*b*, and so on for the third and fourth power inlets 128*c* and *d*, respectively. In the foregoing manner, the switch 100 provides redundant power inlets 114 and 128 that can accommodate a broad range of switch placement orientations that are not limited by the location of the power inlets.

In another aspect of this embodiment, the network switch 100 includes a plurality of air movers for moving cooling air along an air flow path from front to back through the computer cabinet 102 as indicated by the arrows A. In the illustrated embodiment, the air movers are a plurality of fan units 124*a-l* which are carried toward the aft end 106 of the cabinet 102. Each of the fan units 124 can include an electric motor (not shown) that drives a corresponding fan (also not shown). The fan units 124 can be arranged in four columns of three, in which each column of three fan units 124 comprises a corresponding fan tray. As described in more detail below, each of the fan trays can be operably connected to a corresponding fabric card oriented vertically within the aft portion of the cabinet 102. In operation, the fan units 124 draw air into the computer cabinet 102 via air inlets at the front end 104, and move the air through the computer cabinet in a generally linear direction from front to back as indicated by the arrows A, before the air exits the cabinet 102 via the outlets at the aft end 106. If needed, individual fan units 124 can be removed from the cabinet 102 by operation of a corresponding handle 125.

The air inlets at the front end 104 of the cabinet 102 are comprised of a plurality of vents associated with the various computer modules installed in the front portion of the cabinet 102. More specifically, each of the line cards 108 includes a face panel 130 having a plurality of connector ports 136 surrounded by a perforated portion 118. The perforated portion 118 includes a plurality of apertures that serve as air inlet vents into the computer cabinet 102. Similarly, each of the control modules 112 includes a corresponding face panel 132 having a perforated portion 120 and one more connector ports 138. Each of the power units 116 also includes a corresponding face panel 134 having a corresponding perforated portion 122. Accordingly, in the illustrated embodiment, each of the perforated portions 118, 120 and 122 includes a plurality of apertures that collectively form the air inlet vents into the computer cabinet 102. The apertures can have, for example, hexagonal shapes arranged in a honeycomb pattern. In other embodiments, the apertures can have rectangular, round, and/or other shapes in other regular and/or irregular patterns. In some embodiments the perforated face panels of the line cards 108, the control modules 112, and the power units 116 can be made from aluminum, such as aluminum extrusions that are machined to provide the apertures, connector ports, and/or other features. The extrusions can have thicknesses of from about one millimeter to about six millimeters, or from about two millimeters to about three millimeters. Additionally, each of the apertures can be defined by a sidewall or web that has a width of from about 0.1 millimeter to about 1 millimeter, or about 0.2 millimeter to about 0.5 millimeter, or about 0.3 millimeter. In some embodiments, the apertures can shaped and sized so that the perforated portions 118, 120 and 122 are from 75% to 90% open, or from about 79% to about 86% open, or about 82% open, for efficient air flow into the cabinet 102 for cooling the internal components. As noted above, in some embodiments the face panels 130, 132 and 134 can be formed from extruded aluminum that is machined to provide the plurality of apertures in the perforated portions 118, 120 and 122. One such product is referred to as MicroVent® and is provided by Atrenne Computing Solutions of 10 Mupac Drive, Brockton, Me. 02301. In other embodiments, other materials can be used to provide the vented face panels 130, 132, and 134.

Turning next to FIG. 1B, each of the fan units 124 includes a perforated cover 126. The perforated covers 126 can be made from the same material as the perforated face panels 130, 132, and 134 described above with reference to FIG. 1A. In operation, the fan units 124 are operable to draw ambient cooling air into the cabinet 102 via the air inlets formed by the perforated portions of the face panels 118, 120 and 122 at the front end 104. As described in greater detail below, the cabinet 102 lacks a backplane or midplane oriented perpendicular to the air flow through the cabinet, and as a result, the air flows in a generally unobstructed, linear path through the cabinet 102 before exiting through the perforated covers 126 of the fan units 124. This, combined with the relatively high percentage of open area (e.g., 82%-86% open) of the air inlets and outlets, can result in relatively low operating temperatures for the internal switch components, which in turn can increase operating speed and component service life. For example, in some embodiments these improvements can result in operating temperatures of between about 50° C. to about 60° C., or about 55° C., as compared to, for example, 70° C. for a typical network switch enclosure.

Figure 2:
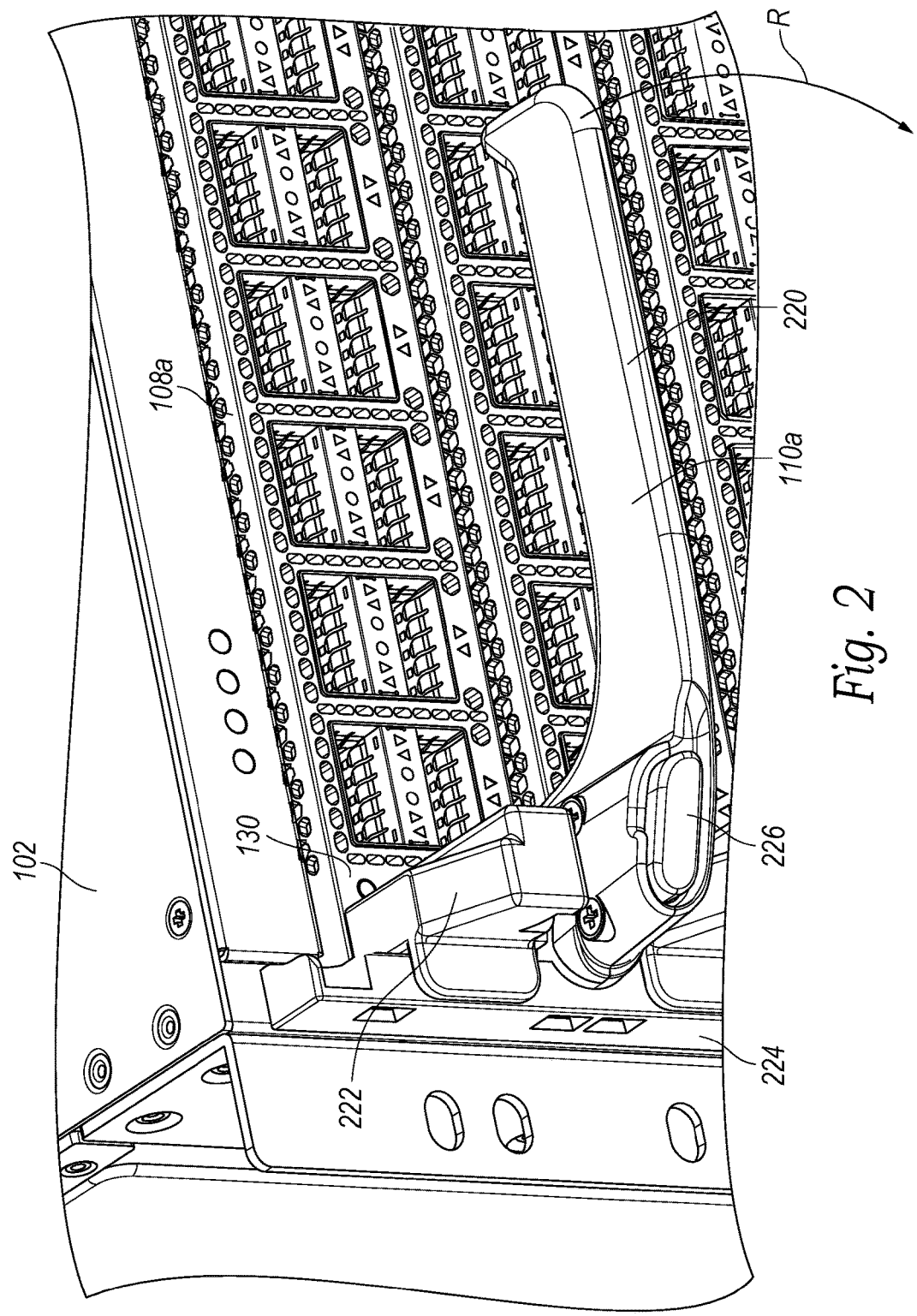
FIG. 2 is an enlarged isometric view of a front portion of the computer system of FIG. 1A illustrating a latch for retaining a computer module in a computer cabinet in accordance with an embodiment of the present technology.

FIG. 2 is an enlarged isometric view of a front portion of the cabinet 102 illustrating one of the first latches 110*a* (the "latch 110") in greater detail. In the illustrated embodiment, the latch 110 includes a handle 220 pivotally coupled to the first line card 108*a* proximate to the left side of the face panel 130. As described in greater detail below, the handle 220 can be manipulated by a user to insert the line card 108*a* into the cabinet 102 and secure the line card 108*a* in position by engaging the latch 110 with a structural member (e.g., a side rail 224) on the cabinet 102. When the line card 108*a* is fully installed, the handle 220 can be locked in a "closed" position (as shown in FIG. 2) by means of a locking feature on the handle 220 that releasably engages a bracket 222 fixedly attached to the face panel 130. To remove the line card 108*a*, the user can depress a release actuator in the form of a button 226, which automatically rotates the handle 220 away from the cabinet 102 as indicated by the arrow R to disengage the latch 110 from the rail 224 and partially eject the line card 108*a*. The user can then withdraw the line card 108*a* from the cabinet 102.

Figure 3B:
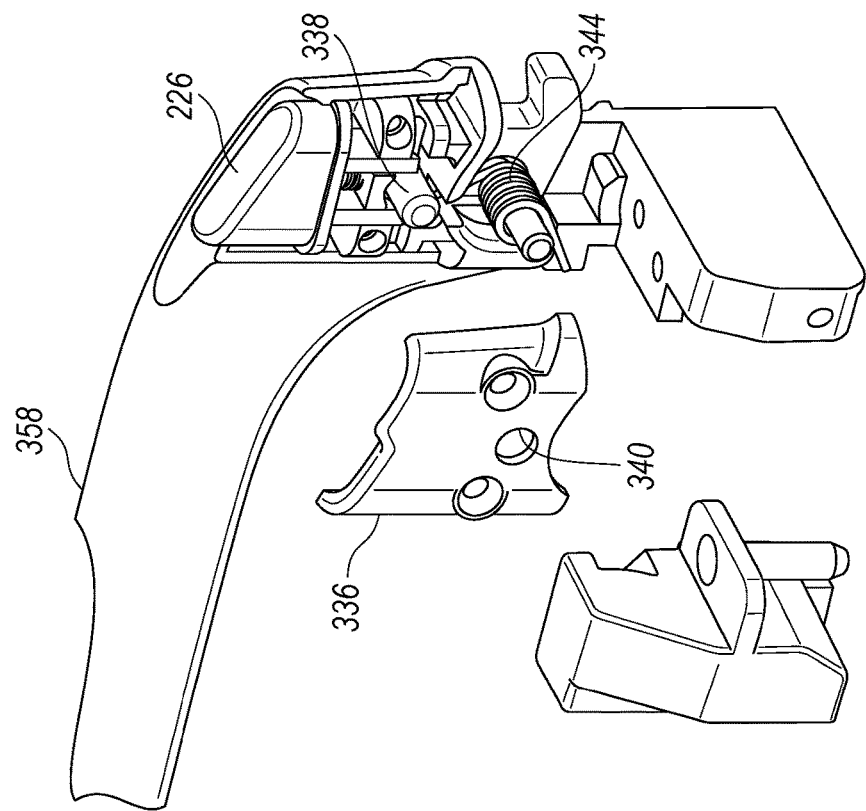
FIG. 3A is an isometric view of the latch of FIG. 2, and FIGS. 3B-3D are a series of partially exploded isometric views of the latch configured in accordance with an embodiment of the present technology.
Figure 3A:
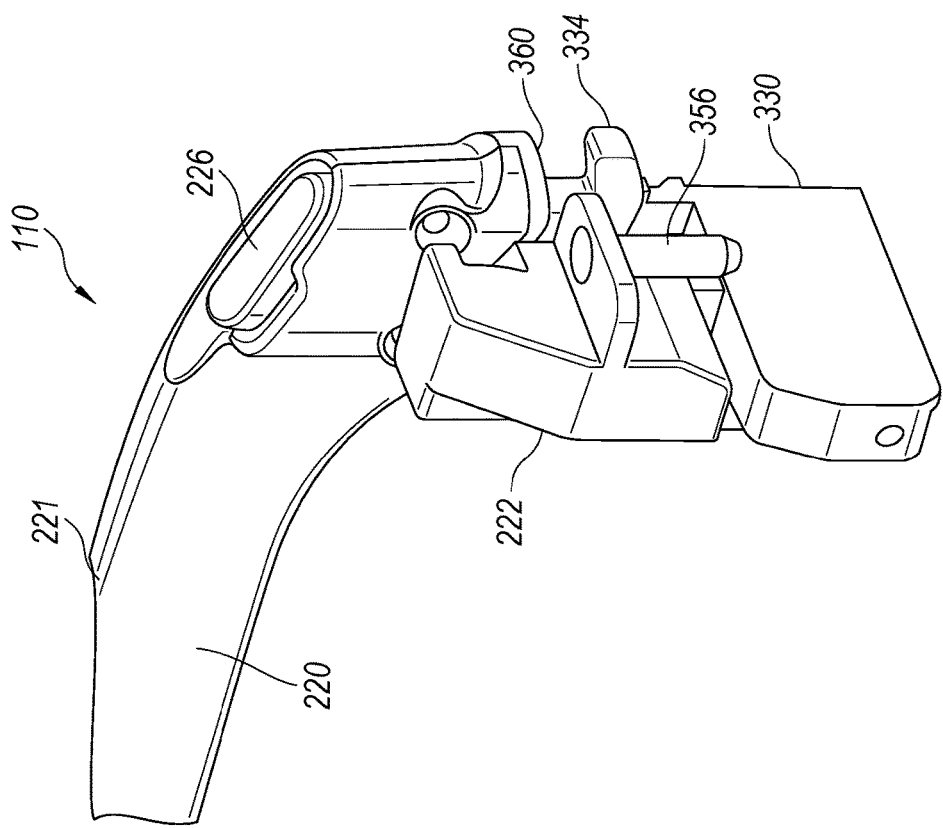

FIG. 3A is an isometric view, and FIGS. 3B-3D are a series of partially exploded isometric views, of the latch 110 configured in accordance with an embodiment of the present technology. Referring to FIGS. 3A-3D together, the handle 220 is pivotally coupled to a base fitting 330 via a pivot pin 332. As noted above with reference to FIG. 2, the base fitting 330 is fixedly attached to the outer edge portion of the line card 108*a*. A torsional biasing member 344 (e.g., a torsion spring) is operably coupled between the handle 220 and the bracket 222, and biases the handle 220 away from the closed position illustrated and toward an outward or open position. The distal end portion of the handle 220 includes a manual gripping portion 221 and the proximal end portion of the handle 220 includes a retention feature 334 in the form of a hook that extends beneath a heel 360 having a slightly curved or convex surface. As described in more detail below with reference to FIGS. 4A-4E, the bracket 222 carries a cylindrical guide pin 356 that cooperates with the retention feature 334 to align and engage the line card 108a with the computer cabinet 102 when the handle 220 is rotated toward the closed position illustrated in FIGS. 2-3D.

The button 226 is housed in a recess behind a removable cover 336, and is biased upwardly via a biasing member 352 (e.g., a coil spring in compression). Downward movement of the button 226 retracts a locking feature 338 that is biased outwardly away from the handle 220 and toward the bracket 222 by means of a biasing member 346 (e.g., a coil compression spring). More specifically, as shown in FIG. 3C, the button 226 includes two angled surfaces 350 extending downwardly therefrom which are configured to slideably contact opposite end portions of a pin 348 that extends transversely through the locking feature 338.

In the illustrated embodiment, the locking feature 338 is a protruding cylindrical pin or member having a rounded distal end portion configured to movably extend through an aperture 340 in the cover 336. Referring to FIG. 3D, the bracket 222 includes an angled ramp 354 leading up to a cylindrical recess 342. As described in greater detail below, in operation the rounded end portion of the locking feature 338 first makes contact with the ramp 354 when the handle 220 is rotated inwardly (i.e., opposite to the direction indicated by the arrow R in FIG. 2) from the full open position. As the handle 220 continues to rotate inwardly toward the position shown in FIG. 3A, the locking feature 338 travels up the ramp 354 toward the recess 342. Because the ramp 354 is angled toward the handle 220, as the locking feature 338 slides up the ramp 354, it is also driven inwardly toward the handle 220 against the biasing member 346. However, once the handle 220 is in the fully closed position shown in FIG. 3A, the locking feature 338 is aligned with the recess 342 and the biasing member 346 drives the rounded end portion of the locking feature 338 into the recess 342 to lock the handle 220 in the closed position. In some embodiments, the handle 220, the base fitting 330, the bracket 222, the guide pin 356, the locking feature 338 and/or other elements of the latch 110 can be formed from suitable metals known in the art, such as aluminum or stainless steel, by machining, casting, and/or other suitable forming methods known in the art. In other embodiments, other suitable materials, (e.g. plastics, etc.) may be used for one or more of the latch elements described herein.

Referring to FIG. 3C, to release the handle 220 from the closed position, a user depresses the button 226 in the downwardly direction D against the biasing member 352. As the button 226 moves downwardly, the angled surfaces 350 bear against the pin 348 and drive the locking feature 338 inwardly toward the handle 220 against the biasing member 346, thereby extracting the distal end portion of the locking feature 338 from the recess 342 and allowing the torsional biasing member 344 to automatically rotate the gripping portion 221 of the handle 220 outwardly toward the open position. As this happens, the heel 360 of the handle 220 rotates into contact with the rail 224 and pries against the rail 224 to automatically push the latch 110 away from the rail 224 and partially eject the line card 108a from the cabinet 102.

Figure 4A:
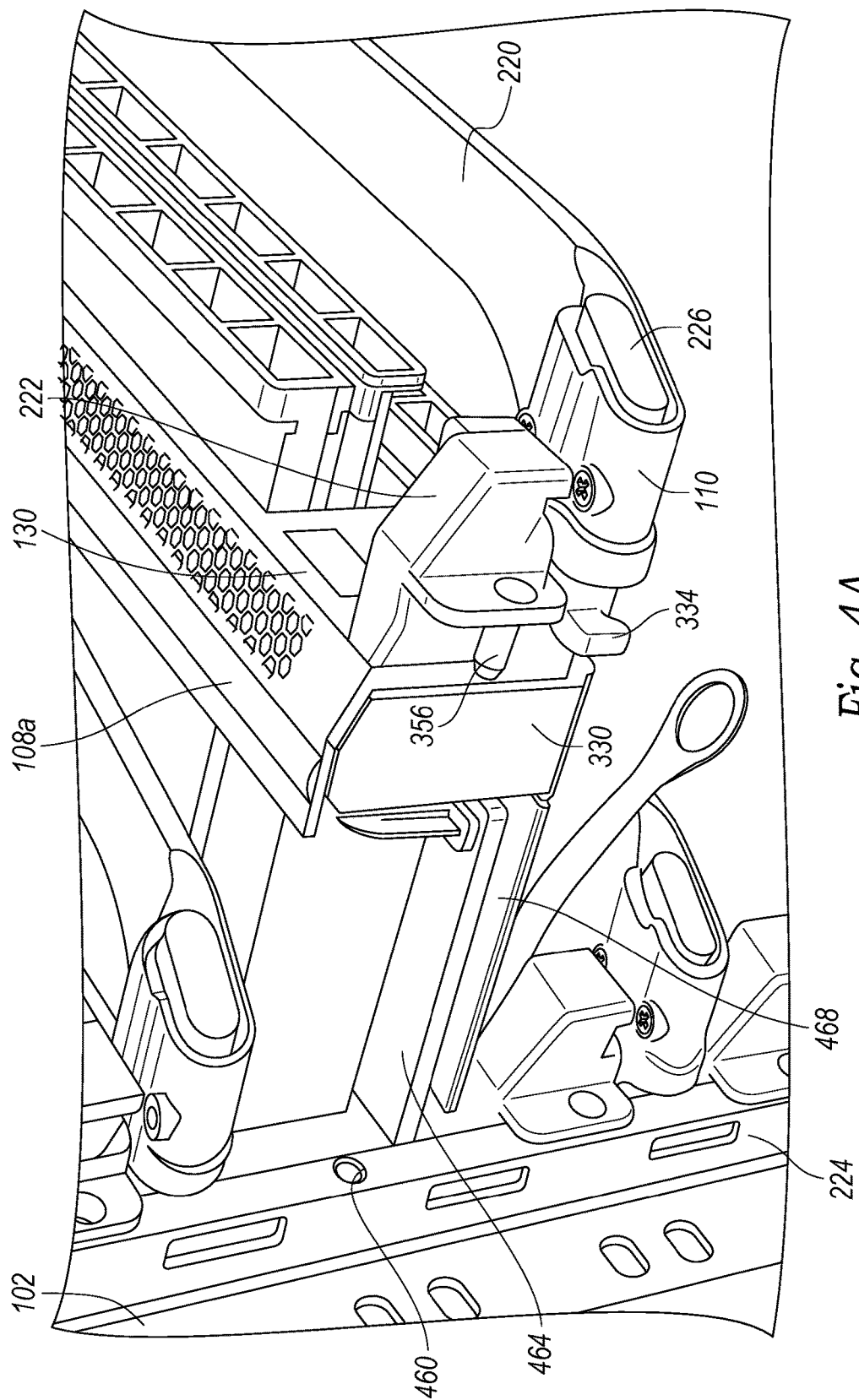
FIGS. 4A-4E are a series of isometric views illustrating operation of the latch of FIGS. 2-3D in accordance with an embodiment of the present technology.
Figure 4B:
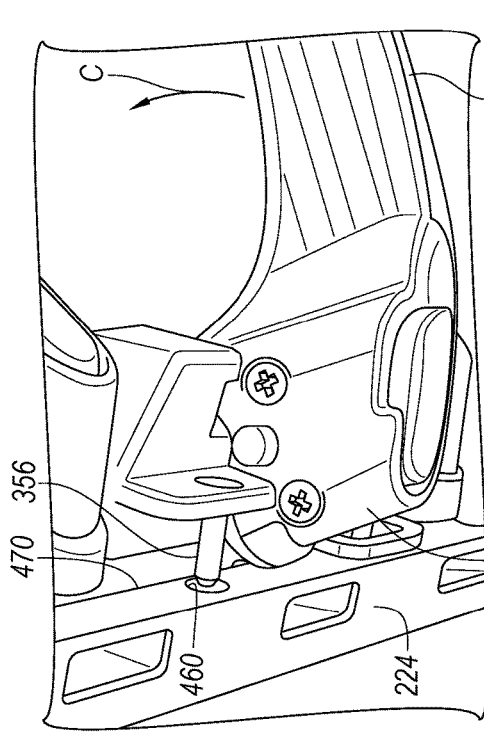

FIGS. 4A-4E are a series of isometric views illustrating use of the latch 110 to install a line card (e.g., the line card 108a) in the cabinet 102 in accordance with an embodiment of the present technology. Referring first to FIG. 4A, the line card 108a includes a chassis 468 that supports the face panel 130 and a circuit board 464 which carries associated electronic components and circuitry. Both the bracket 222 and the base fitting 330 are fixedly attached to the chassis 468 proximate the left edge of the face panel 130. In the illustrated embodiment, the bracket 222 and the base fitting 330 are separate components. However, in other embodiments, the bracket 222 and the base fitting 330 can be portions of a unitary component.

Figure 4C:
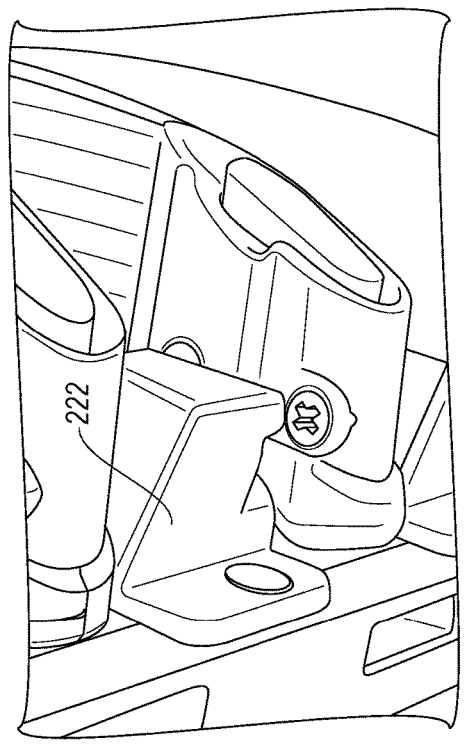
Figure 4D:
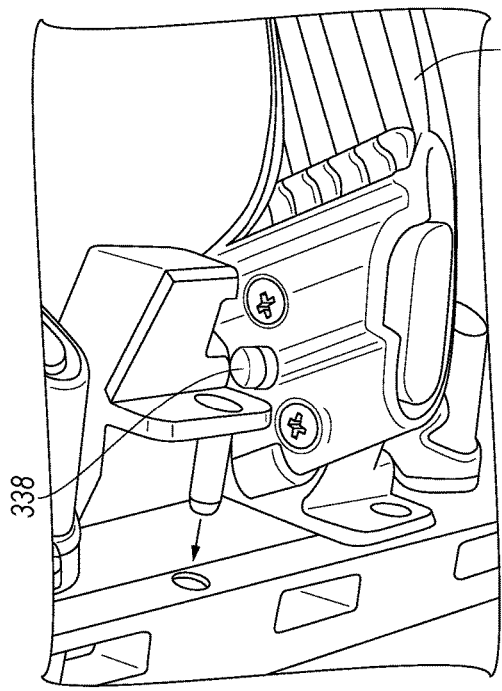
Figure 4E:
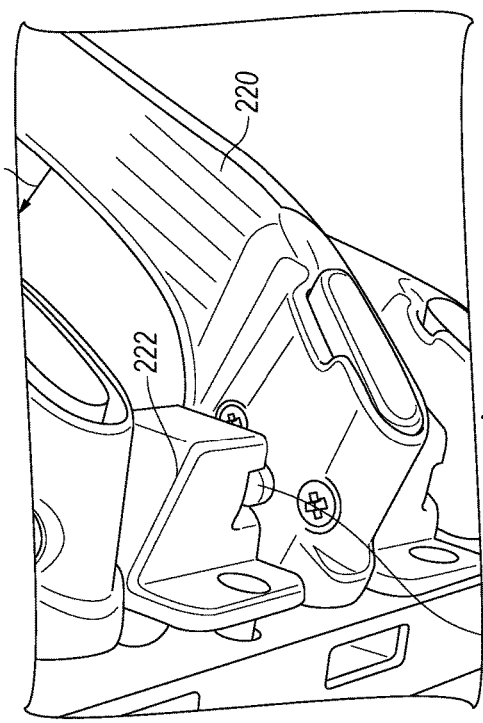

In FIG. 4A, the line card 108a is partially inserted into the cabinet 102. To fully install the line card 108a, the user can depress the button 226 to disengage the locking feature 338 (FIG. 3B) from the recess 342 in the bracket 222, thereby allowing the handle 220 to rotate outwardly to the open position shown in FIG. 4B. The user can then push the line card 108a into the cabinet 102 via the handle 220 until the nose of the handle 220 contacts the rail 224 on the side of the cabinet 102, as shown in FIG. 4C. In this position, the distal end portion of the guide pin 356 has just begun to extend through a corresponding guide hole 460 in the rail 224. From the position shown in FIG. 4C, the user rotates the gripping portion 221 of the handle 220 inwardly as indicated by arrow C. This drives the hook 334 (FIG. 3A) underneath an edge portion 470 of the rail 224 until the upper surface of the hook 334 contacts the underside of the edge portion 470. Continued inward rotation of the handle 220 as shown in FIG. 4D causes the hook 334 to pry against the edge portion 470, which in turn drives the guide pin 356 further into the aperture 460 and brings the line card 108 into the fully installed position shown in FIG. 4E. Full rotation of the gripping portion 221 of the handle 220 to the closed position also drives the distal end portion of the locking feature 338 into the recess 342 in the bracket 222 (FIG. 3D), thereby locking the handle 220 in the closed position and securing the line card 108a in the cabinet 102. To release the latch 110 from the closed position, the user depresses the button 226 in the downwardly direction D (FIG. 3C). This retracts the locking feature 338, and allows the torsional biasing member 344 to automatically rotate the handle 220 outwardly toward the open position, thereby disengaging the hook 334 and driving the heel 360 against the rail 224 to eject the line card 108a from the cabinet 102.

As noted above and as illustrated in FIG. 1A, each line card 108 includes a first latch 110a on one side the line card 108 and a second latch 110b on an opposite side of the line card 108. To release and remove a line card 108 from the cabinet 102, the user can depress the buttons 226 on each of the latches 110 and rotate the corresponding handles 220 outwardly to disengage the latches 110 from the corresponding cabinet structures. The line card 108 can then be fully removed by simply pulling outwardly on the latches 110 until the line card 108 is fully withdrawn from the cabinet 102.

Figure 5A:
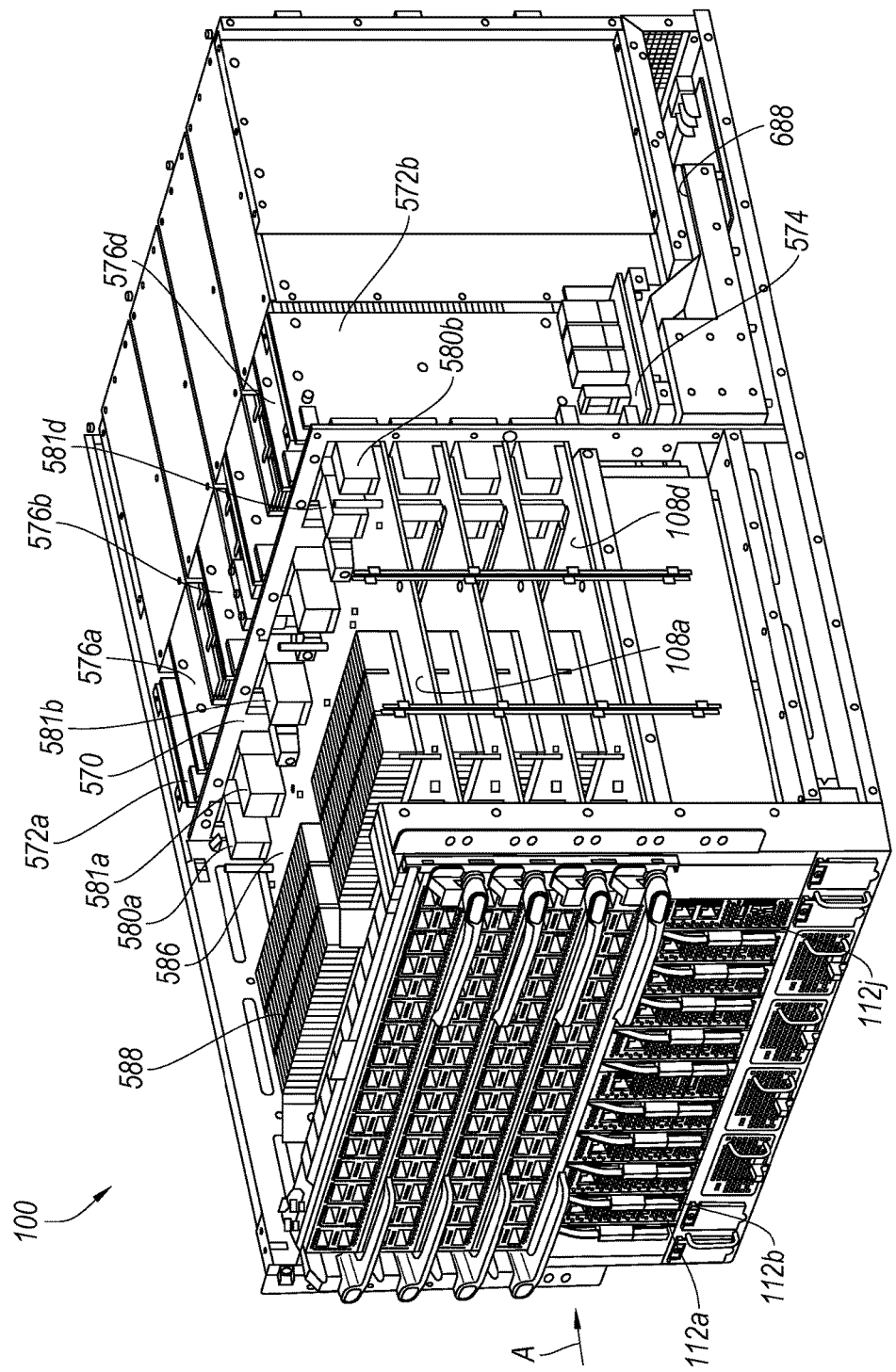

FIGS. 5A and 5B are front and rear isometric views, respectively, of the network switch 100 in which a number of exterior panels have been removed from the cabinet 102 for purposes of illustration. Referring first to FIG. 5A, as noted above, the network switch 100 includes a plurality of the line cards 108a-108d arranged horizontally with one above the other. In the illustrated embodiment, each of the line cards 108 includes electronic circuitry (e.g., one or more ASICs 588) mounted to a corresponding circuit board 586. As also noted above, the control modules 112 are positioned beneath the line cards 108, and are oriented vertically in a side-by-side arrangement. Each of the control modules 112 can include at least one CPU mounted to a corresponding circuit board. As illustrated in FIG. 5A, the line cards 108 and the control modules 112 are arranged in edgewise orientation relative to the air flow through the computer cabinet 102 as indicated by the arrow A. As used herein, the term "edgewise orientation" means that the planer circuit board surfaces of the corresponding line cards 108 and control modules 112, for example, are oriented with an edge facing the air flow through the cabinet, so that their planer circuit board surfaces will be parallel to the air flow through the cabinet, as opposed to being oriented perpendicularly relative to the air flow as would be the case for a conventional backplane or midplane.

Referring to FIGS. 5A and 5B together, the aft portion of the cabinet 102 contains a plurality of fabric cards 576 (identified individually as fabric cards 576*a-d*) oriented vertically and side-by-side relative to each other. Each of the fabric cards 576 includes a circuit board 592 that carries electronic circuitry (e.g., one or more ASICs 590) that function as switching elements to route data from the line cards 108 through the network switch. An aft-edge portion of each of the fabric cards 576 can carry a fan control board for providing electrical power and control to each of the corresponding fan trays. Like the line cards 108 and control modules 112 described above, the fabric cards 576 are also positioned in edgewise orientation relative to the air flow through the cabinet 102. Additionally, as can be seen by reference to FIGS. 5A and 5B, the line cards 108 are orthogonally arranged relative to the control modules 112 and the fabric cards 576.

Figure 6A:
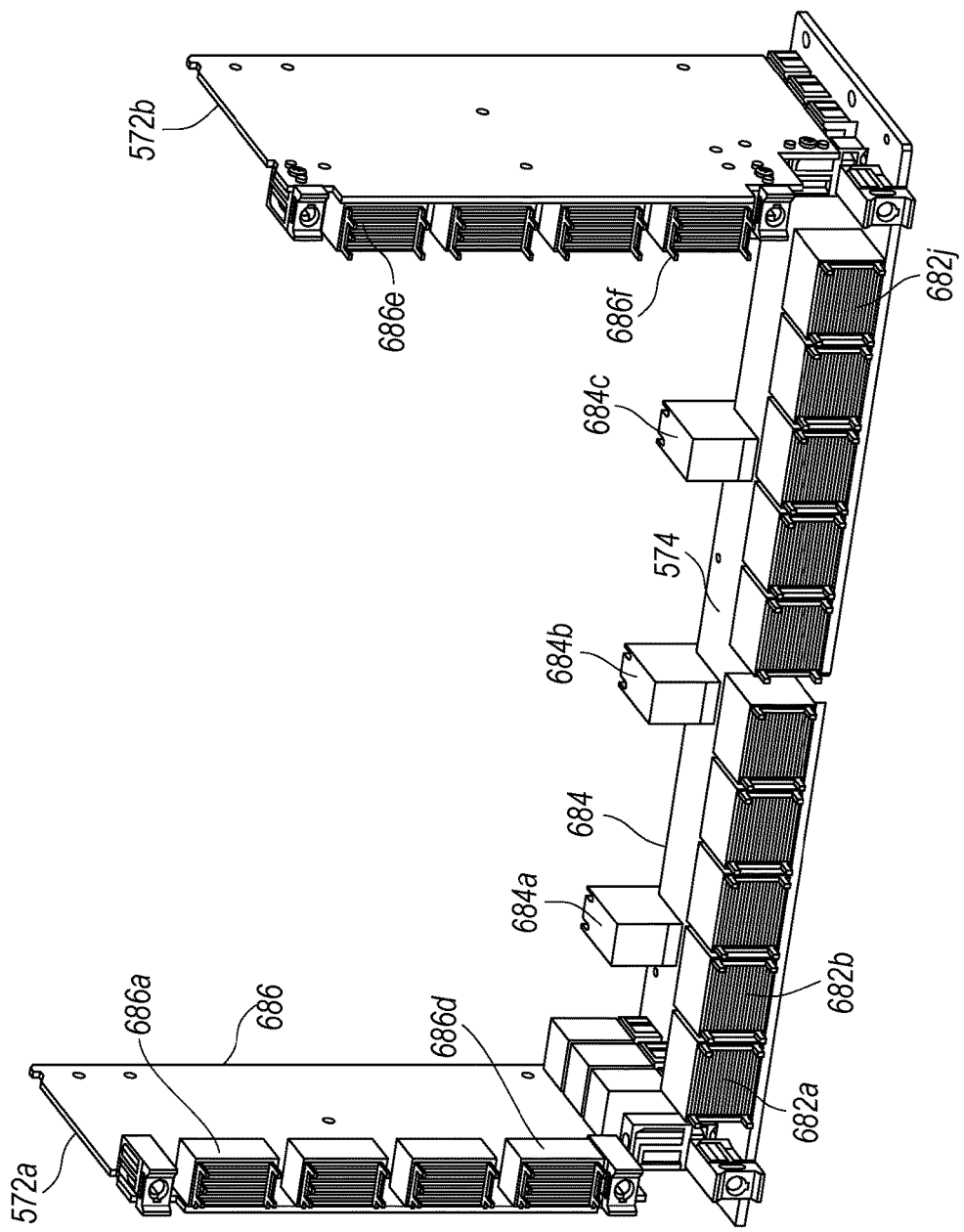
FIG. 6A is an isometric view of a control plane assembly configured in accordance with an embodiment of the present technology.

In the illustrated embodiment, the network switch 100 further includes a left vertical control plane (VCP) 572*a* and a right VCP 572*b* (the right VCP 572*b* is omitted from FIG. 5B for purposes of clarity) operably connected to a horizontal control plane (HCP) 574 at a mid-frame 570. These components are better seen in FIG. 6A, which is an enlarged isometric view of the assembly of the left and right VCPs 572 and the horizontal HCP 574, and in FIG. 6B, which is a front view of the cabinet 102 with many of the electronic components removed for purposes of illustration. Referring first to FIG. 6A, the left VCP 572*a* includes a plurality of line card connectors 686 (identified individually as line card connectors 686*a-d*) mounted to a front edge portion thereof, and the right VCP 572*b* includes a similar arrangement of line card connectors 686*e-686f*. As illustrated in FIG. 5A, each of the line cards 108 includes a left VCP connector 580*a* and right VCP connector 580*b*. Each of the left and right VCP connectors 580 is operably connected to a corresponding one of the line card connectors 686 on the corresponding left or right VCP 572.

Returning to FIG. 6A, the HCP 574 includes a plurality of control module connectors 682 (identified individually as control module connectors 682*a-j*) mounted to a front edge portion thereof. As illustrated in FIG. 5B, each of the control module connectors 682 is operably connected to a corresponding HCP connector on an aft end of each of the control modules 112*a-j*. As discussed above, in some embodiments the switch 100 has a disaggregated architecture in which the CPU's for control of the ASICs on the line cards 108 and the fabric cards 576 are mounted to the control modules 112, instead of being mounted to the line cards 108 and/or the fabric cards 576. One advantage of this architecture is that the control modules 112 can be individually removed from the cabinet 102 if needed to upgrade the CPUs (by, for example, withdrawing the control modules 112 from the front end of the cabinet 102 and disconnecting the connector 682), without having to remove any of the line cards 108 or the fabric cards 576 and take them out of service. More specifically, in some embodiments, an individual control module 112 can be removed for CPU upgrade while the corresponding line card and/or fabric card that it controls remains in service. In such embodiments, when the control module 112 with the upgraded or new CPU is reinstalled in the switch, the CPU informs the switch ASIC on, e.g. the corresponding line card 108, and the switch ASIC configures the newly added CPU (e.g., provides routing tables) and the CPU can take control of the switch ASIC from now on.

The HCP 574 additionally includes a plurality of fabric card connectors 684 (identified individually as fabric card connectors 684*a-d*) mounted to an aft-edge portion thereof. As illustrated in FIG. 5B, each of the fabric cards 576 includes a corresponding HCP connector 584 (first identified individually as HCP connectors 584*a-d*) that is electrically connected to a corresponding one of the fabric card connectors 684 on the HCP 574. In the foregoing manner, the VCPs 572 and the HCP 574 form a control plane of the network switch 100 for interconnecting the various computer modules (e.g., for connecting the control modules 112 with the line cards 108, the fabric cards 576, etc.) without requiring a midplane or backplane oriented perpendicularly to the air flow through the cabinet 102. Accordingly, by providing the U-shaped control plane assembly illustrated in FIG. 6A, a perpendicular midplane or backplane can be omitted.

In addition to being electrically connected to the vertical control planes 572, each of the line cards 108 is directly connected to each of the fabric cards 576. More specifically, as shown in FIG. 5A, each of the line cards 108 carries four fabric card connectors 581 (identified individually as fabric card connectors 581*a-d*). Similarly, as shown in FIG. 5B, each of the fabric cards 576 carries four corresponding line card connectors 582 (identified individually as line card connectors 582*a-d*). Each of the fabric card connectors 581 on the line cards 108 is directly electrically connected to the corresponding line card connectors 582 on each of the fabric cards 576. In the foregoing manner, each of the line cards 108 is in direct electrical communication with each of the fabric cards 576 in the absence of, for example, an intervening circuit board connection. The direct connection between the line cards 108 and the fabric cards 576 can shorten the signal path and improve the quality of signals exchanged between these components. Additionally, the connectors 581, 582 are sized and positioned to reduce the impact on air flow through the cabinet 102.

Figure 6B:
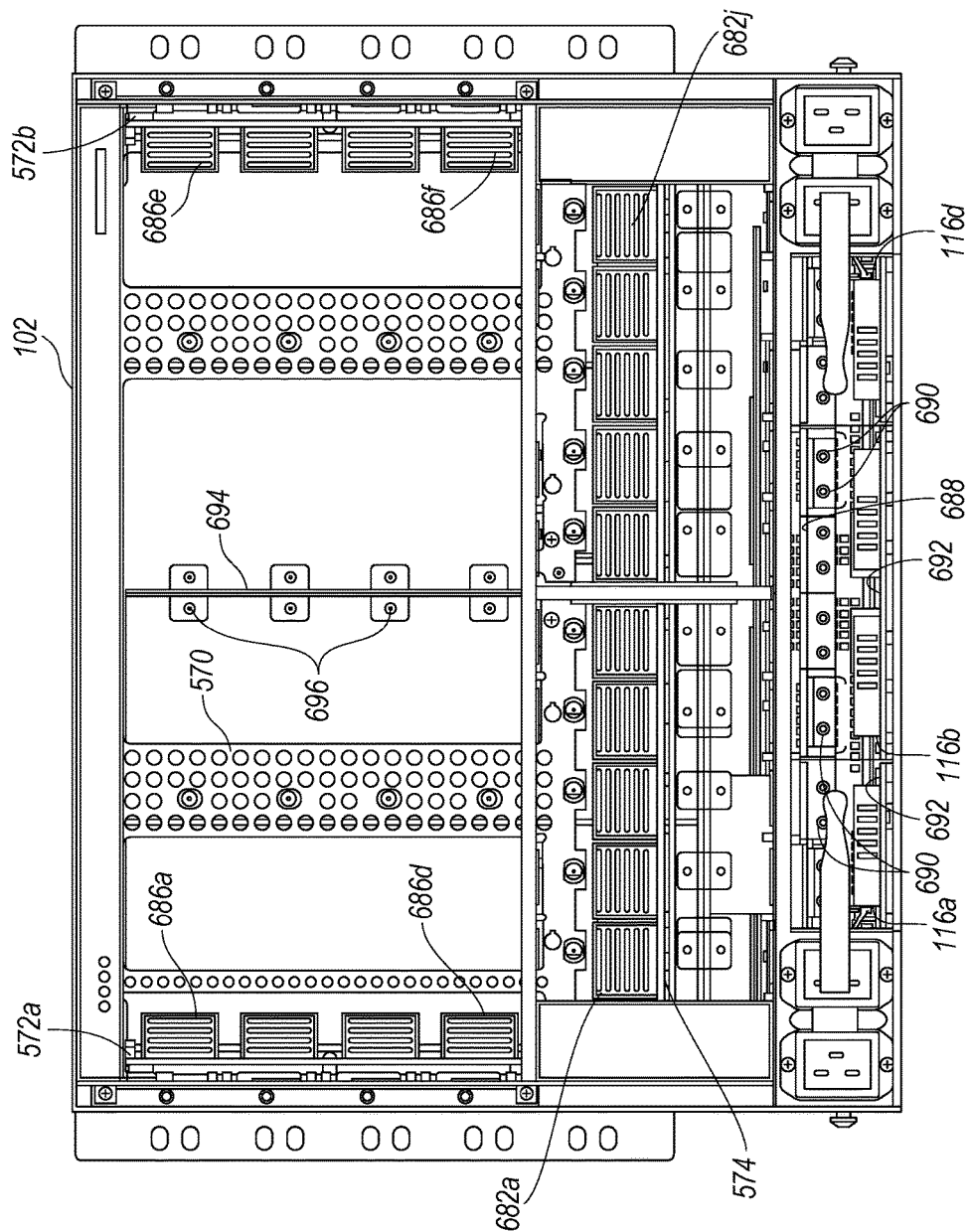
FIG. 6B is a front view of the associated computer cabinet with a number of electronic components removed for purposes of illustration.

As shown in FIG. 6B, the left VCP 572*a* is oriented vertically proximate the left side wall of the cabinet 102, and the right VCP 572*b* is similarly positioned proximate the right side wall of the cabinet 102. The HCP 574 is connected to the bottom of each of the VCPs 572, and extends horizontally across a lower-mid portion of the cabinet 102 in edgewise orientation relative to the air flow through the cabinet 102. The line card connectors 686 are offset to opposite sides of the cabinet 102, and the control module connectors 682 are generally positioned below the line card connectors 686. The switch 100 further includes a horizontal bus bar (HBAR) 688 (also shown in FIG. 5A) and a vertical bus var (VBAR) 694. The VBAR 694 extends vertically in a central portion of the cabinet 102 proximate the aft edges of the line cards 108, and carries a plurality of connectors 696 for providing power to the line cards 108. The HBAR 688 extends horizontally across the cabinet 102 and carries a plurality of connectors 690 which connect to the power units 116 for receiving power therefrom. As illustrated in FIG. 6B, each of the power units 116 includes a corresponding circuit board 692 oriented horizontally and parallel to the air flow through the cabinet 102. Accordingly, because the line cards 108, the fabric cards 576, the control modules 112, and the power units 116 in the illustrated embodiment are positioned parallel to the air flow through the cabinet 102 in the absence of either a midplane and/or a backplane oriented perpendicular to the air flow, cooling air can flow through the cabinet 102 in a generally linear direction without having to make 90° turns or otherwise be disrupted by a conventional backplane or midplane. As a result of this efficient air flow, the network switch 100 can operate at substantially lower temperatures than conventional network switches. For example, in some embodiments, the network switch 100 can operate at temperatures of about 55° C., rather than temperatures of about 70° C. as typically found in conventional network switches and other similar computer systems. Although specific circuitry may be described above, those of ordinary skill in the art will recognize that aspects of the present technology are not limited to the particular arrangements illustrated herein, but can be implemented in various other modular arrangements of switch circuitry.

Figure 7:
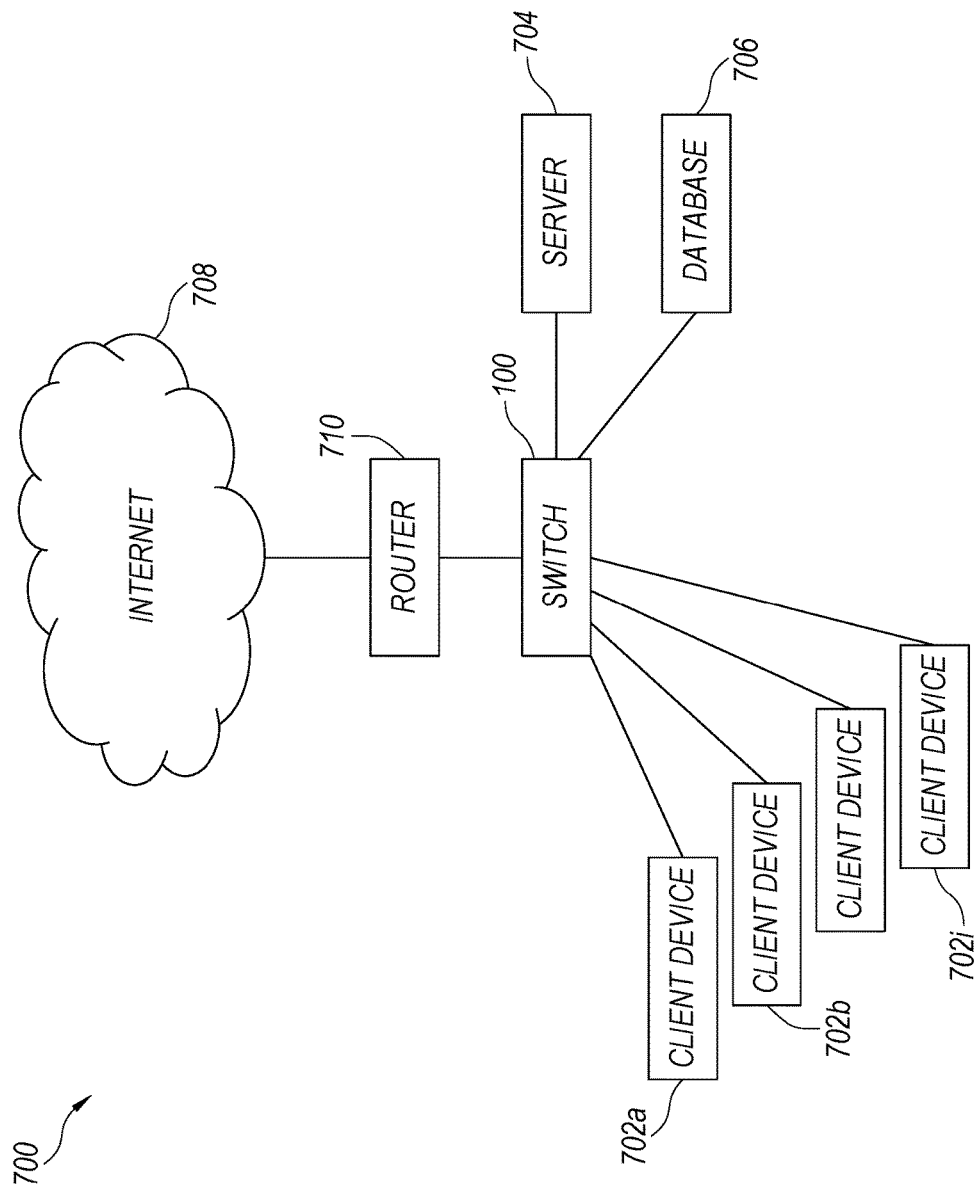
FIG. 7 is a schematic diagram illustrating one possible environment in which embodiments of the present technology can be implemented.

FIG. 7 in the following discussion provide a brief, general description of a suitable computing environment 700 in which the network switch 100 can be implemented. In the illustrated embodiment, the switch 100 can be implemented in a networked environment using logical connections to one or more remote computers, such as a plurality of client devices 702 (identified individually as client devices 702a-i). The client devices 702 can include, for example, personal computers or work stations, etc. having one or more associated processors coupled to one or more user input devices, data storage devices, etc. The switch 100 can also be operably connected to one or more servers 704 and/or an associated databases 706. In operation, the switch 100 can receive data from one or more of the client devices 702 and efficiently route or transmit the data to one or more different devices in the environment 700, or to an additional remote device via a router 710 and the Internet 708. Aspects of the disclosed technology, however, are not limited to any particular environment, and may be practiced in a variety of other computing environments.

Those skilled in the relevant art will appreciate that aspects of the technology disclosed herein can be practiced with other communications, data processing, or computer system configurations, including: Internet appliances, hand-held devices (including personal digital assistants (PDAs)), wearable computers, all manner of cellular or mobile phones (including Voice over IP (VoIP) phones), dumb terminals, media players, gaming devices, multi-processor systems, microprocessor-based or programmable consumer electronics, set-top boxes, network PCs, mini-computers, mainframe computers, and the like. Indeed, the terms "computer," "server," "host," "host system," and the like are generally used interchangeably herein, and refer to any of the above devices and systems, as well as any data processor. Aspects of the invention can be embodied in a special purpose computer or data processor that is specifically programmed, configured, or constructed to perform one or more of the computer-executable instructions explained in detail herein. While aspects of the invention, such as certain functions, are described as being performed exclusively on a single device, the invention can also be practiced in distributed environments where functions or modules are shared among disparate processing devices, which are linked through a communications network, such as a Local Area Network (LAN), Wide Area Network (WAN), or the Internet. In a distributed computing environment, program modules may be located in both local and remote memory storage devices.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology. Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples and embodiments of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples: alternative implementations may employ differing values or ranges.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

We claim:

1. A computer system comprising:
   a cabinet having a first end and a second end opposite the first end, wherein the first end includes a plurality of individual openings;
   a plurality of computer modules, wherein each computer module includes a circuit board and a face panel, wherein each circuit board is operably positioned within the cabinet and each face panel fits across a corresponding one of the openings, and wherein each face panel includes a perforated portion that is from 75% to 90% open;
   at least one air mover mounted to the cabinet, wherein the air mover is configured to draw air into the cabinet via the perforated potions of the face panels and move the air over the circuit boards;
   a plurality of power supply units positioned within an internal volume of the cabinet, wherein each of the power supply units converts mains AC power to DC power for operation of the computer modules;
   a plurality of first AC power inlets positioned at the first end of the cabinet, wherein each of the first AC power inlets includes a receptacle for receiving a power cord connector; and
   a plurality of second AC power inlets positioned at the second end of the cabinet, wherein each of the second AC power inlets includes a receptacle for receiving a power cord connector, wherein each of the power supply units is operably connected to at least one of the first AC power inlets and at least one of the second AC power inlets and is configured to receive AC power from either of the at least one first AC power inlet or the at least one second AC power inlet.

2. The computer system of claim 1 wherein the perforated portions are from 79% to 86% open.

3. The computer system of claim 1 wherein the perforated portions are 82% open.

4. The computer system of claim 1 wherein each face panel is a front panel mounted perpendicularly to a front edge portion of each circuit board.

5. The computer system of claim 1 wherein each face panel is made from a unitary piece of material, and wherein the perforated portion of each face panel includes a plurality of apertures that are machined into the unitary piece of material.

6. The computer system of claim 1 wherein each face panel is made from a unitary piece of material, and wherein the unitary piece of material includes the perforated portion and at least one opening for a connector port.

7. The computer system of claim 1 wherein the perforated portion of each face panel includes a plurality of apertures, wherein each face panel is made from an extruded piece of material that includes the plurality of apertures and at least one opening for a connector port, and wherein the plurality of apertures and the at least one opening are machined into the extruded piece of material.

8. The computer system of claim 1 wherein the perforated portion of each face panel includes a plurality of apertures in a regular pattern, and wherein each of the apertures has the same shape and size.

9. The computer system of claim 1 wherein the perforated portion of each face plate has a plurality of hexagonal apertures in a regular pattern.

10. The computer system of claim 1 wherein the perforated portion of each face plate has a plurality apertures in a honeycomb pattern.

11. The computer system of claim 1 wherein each face panel is comprised of aluminum material having a thickness of from 1 mm to 6 mm, and wherein the perforated portion of each face panel includes a plurality of apertures in a regular pattern, wherein the plurality of apertures are separated by side walls having a width of from 0.2 mm to 0.5 mm.

12. The computer system of claim 1 wherein the circuit boards are first circuit boards positioned parallel to each other, and wherein the computer system further comprises:
   a plurality of second circuit boards positioned parallel to each other and nonparallel to the first circuit boards within the cabinet, wherein the at least one air mover is configured to draw air into the cabinet via the perforated potions of the face panels and move the air in a direct path through the computer cabinet over the first and second circuit boards, and wherein the first and second circuit boards are oriented in edgewise orientation relative to the air path.

13. A modular network switch comprising:
   an enclosure having a first end and a second end opposite the first end, wherein the first end includes a plurality of openings;
   a plurality of line cards, wherein each line card includes a first circuit board and a face panel, wherein each first circuit board is operably positioned within the enclosure and each face panel fits across a corresponding one of the openings, and wherein each face panel includes a perforated portion that is from 79% to 86% open;

a plurality of fabric cards positioned parallel to each other in the enclosure and nonparallel to the line cards, wherein each fabric card includes a second circuit board;

at least one air mover mounted to the enclosure, wherein the air mover is configured to draw air into the enclosure via the perforated potions of the face panels and move the air through the enclosure over the first and second circuit boards, and wherein the first and second circuit boards are oriented in edgewise orientation relative to the air path;

a plurality of power supply units positioned within an internal volume of the enclosure, wherein each of the power supply units converts mains AC power to DC power for operation of the line cards and the fabric cards;

a plurality of first AC power inlets positioned at the first end of the enclosure, wherein each of the first AC power inlets includes a receptacle for receiving a power cord connector; and a plurality of second AC power inlets positioned at the second end of the enclosure, wherein each of the second AC power inlets includes a receptacle for receiving a power cord connector, wherein each of the power supply units is operably connected to at least one of the first AC power inlets and at least one of the second AC power inlets and is configured to receive AC power from either of the at least one first AC power inlet or the at least one second AC power inlet.

14. The modular network switch of claim 13 wherein each of the line cards is directly electrically connected to a corresponding fabric card in the absence of another circuit board between the respective line cards and fabric cards.

15. The computer system of claim 13:
wherein the plurality of openings in the first end of the cabinet are first openings,
wherein the second end of the cabinet includes at least one second opening,
wherein the at least one air mover includes a fan having a cover that fits across the second opening, wherein the cover has a perforated portion that is from 79% to 86% open, and
wherein the fan is configured to draw air into the cabinet via the perforated potions of the face panels, move the air over the first and second circuit boards, and move the air out of the cabinet via the perforated portion of the fan cover.

16. A network switch comprising:
a cabinet having a first end, a second end opposite the first end, and a plurality of walls defining an internal volume extending between the first and second ends;
a plurality of line cards operably positioned in a first portion of the internal volume, wherein each of the line cards includes at least one port configured to receive data from an external device in a network;
a plurality of fabric cards operably positioned in a second portion of the internal volume, wherein each of the fabric cards includes at least one switch element configured to route the data through the network switch;
a plurality of power supply units positioned within the internal volume, wherein each of the power supply units converts mains AC power to DC power for operation of the line cards and the fabric cards;
a plurality of first AC power inlets positioned at the first end of the cabinet, wherein each of the first AC power inlets includes a receptacle for receiving a power cord connector; and
a plurality of second AC power inlets positioned at the second end of the cabinet, wherein each of the second AC power inlets includes a receptacle for receiving a power cord connector, wherein each of the power supply units is operably connected to at least one of the first AC power inlets and at least one of the second AC power inlets and is configured to receive AC power from either of the at least one first AC power inlet or the at least one second AC power inlet.

17. The network switch of claim 16 wherein the network switch can receive full operating power via the first AC inlets at the first end of the cabinet or the second AC inlets at the second end of the cabinet.

18. The network switch of claim 16 wherein each of the power supply units is operably connected to only one of the first AC inlets and only one of the second AC inlets.

19. The network switch of claim 16, further comprising:
a plurality of air inlet vents vertically oriented at the first end of the cabinet; and
a plurality of air outlet vents vertically oriented at the second end of the cabinet,
wherein the plurality of cabinet walls include a horizontal top wall and a horizontal bottom wall,
wherein the plurality of line cards are horizontally oriented in an upper portion of the internal volume toward the first end of the cabinet,
wherein the plurality of fabric cards are vertically oriented in an upper portion of the internal volume toward the second end of the cabinet,
wherein the plurality of power supply units are arranged side-by-side in a lower portion of the internal volume toward the first end of the cabinet,
wherein the plurality of first AC power inlets are positioned adjacent to the air inlet vents in a lower portion of the first end of the cabinet, and
wherein the plurality of second AC power inlets are positioned adjacent to the air outlet vents in a lower portion of the second end of the cabinet.

20. The network switch of claim 16 wherein the cabinet includes a left side wall spaced apart from a right side wall, wherein the plurality of power supply units are positioned toward a central portion of the cabinet and spaced apart from the left and right side walls, wherein a first portion of the first AC power inlets are positioned between the power supply units and the left side wall, and wherein a second portion of the first AC inlets are positioned between the power supply units and the right side wall.

* * * * *

UNITED STATES PATENT AND TRADEMARK OFFICE
CERTIFICATE OF CORRECTION

PATENT NO. : 10,028,417 B2
APPLICATION NO. : 15/291348
DATED : July 17, 2018
INVENTOR(S) : Schmidtke et al.

Page 1 of 1

It is certified that error appears in the above-identified patent and that said Letters Patent is hereby corrected as shown below:

In the Claims

In Column 13, Line 51, in Claim 1, delete "perforated potions of" and insert -- perforated portions of --, therefor.

In Column 14, Lines 51-52, in Claim 12, delete "perforated potions of" and insert -- perforated portions of --, therefor.

In Column 15, Line 7, in Claim 13, delete "perforated potions of" and insert -- perforated portions of --, therefor.

In Column 15, Line 44, in Claim 15, delete "perforated potions of" and insert -- perforated portions of --, therefor.

Signed and Sealed this
Second Day of October, 2018

Andrei Iancu
*Director of the United States Patent and Trademark Office*